United States Patent
Takeda et al.

(10) Patent No.: US 8,311,073 B2
(45) Date of Patent: Nov. 13, 2012

(54) SEMICONDUCTOR LASER, SEMICONDUCTOR LASER DEVICE, AND FABRICATION METHOD OF SEMICONDUCTOR LASER

(75) Inventors: Kazutaka Takeda, Kanagawa (JP); Takashi Kondo, Kanagawa (JP); Hideaki Ozawa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 40 days.

(21) Appl. No.: 12/879,541

(22) Filed: Sep. 10, 2010

(65) Prior Publication Data

US 2011/0222569 A1 Sep. 15, 2011

(30) Foreign Application Priority Data

Mar. 9, 2010 (JP) ................................. 2010-052117

(51) Int. Cl.
*H01S 3/08* (2006.01)
(52) U.S. Cl. .................... 372/99; 372/50.11; 372/46.013
(58) Field of Classification Search ............... 372/50.11, 372/99, 46.013
See application file for complete search history.

(56) References Cited

U.S. PATENT DOCUMENTS

2003/0031218 A1* 2/2003 Yeh ................................ 372/45
2010/0142570 A1* 6/2010 Konttinen et al. .............. 372/22

FOREIGN PATENT DOCUMENTS

| JP | A-9-214049 | 8/1997 |
| JP | A-2007-299985 | 11/2007 |

* cited by examiner

*Primary Examiner* — Tod T Van Roy
(74) *Attorney, Agent, or Firm* — Oliff & Berridge, PLC

(57) ABSTRACT

A semiconductor laser that includes: a substrate; a first semiconductor multilayer reflector of a first conductive type formed on the substrate; an active region formed on the first semiconductor multilayer reflector; a second semiconductor multilayer reflector of a second conductive type formed on the active region; and an intermediate semiconductor layer of a first conductive type or a second conductive type formed under the first semiconductor multilayer reflector or above the second semiconductor multilayer reflector. An oxidized region formed by oxidizing a part of the intermediate semiconductor layer and an un-oxidized region contacting with the oxidized region are formed in the intermediate semiconductor layer, the un-oxidized region is electrically connected to the first or second semiconductor multilayer reflector, and a beam generated in the active region is reflected at a boundary between the oxidized region and the un-oxidized region to a direction parallel to a principal surface of the substrate, and is emitted from a side surface of the intermediate semiconductor layer.

14 Claims, 14 Drawing Sheets

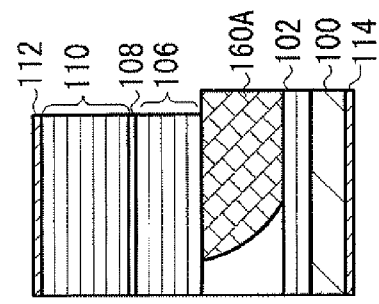
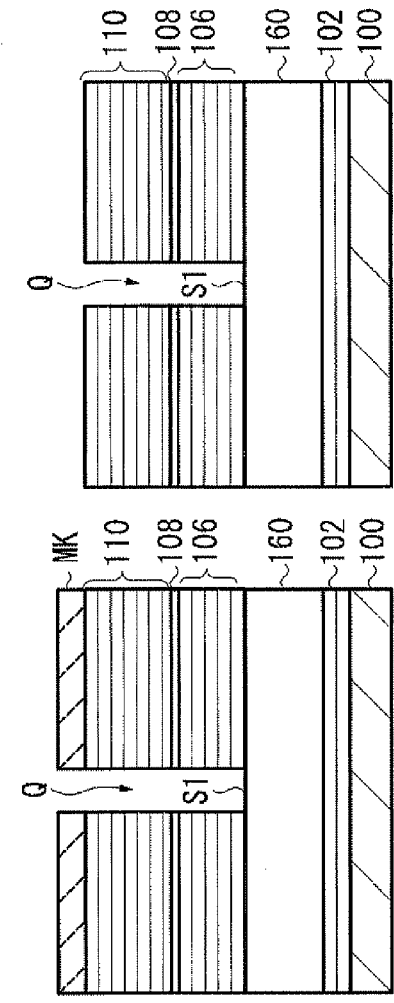
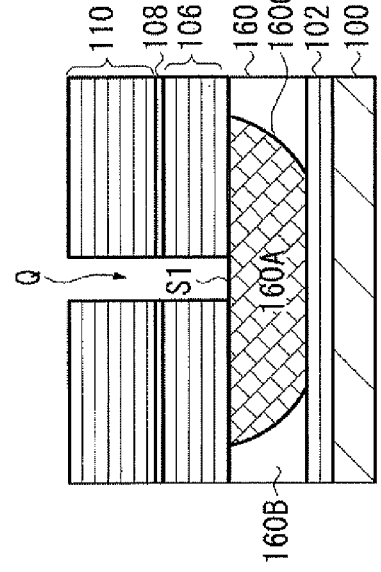
FIG. 12A  FIG. 12B  FIG. 12C
FIG. 12D  FIG. 12E  FIG. 12F

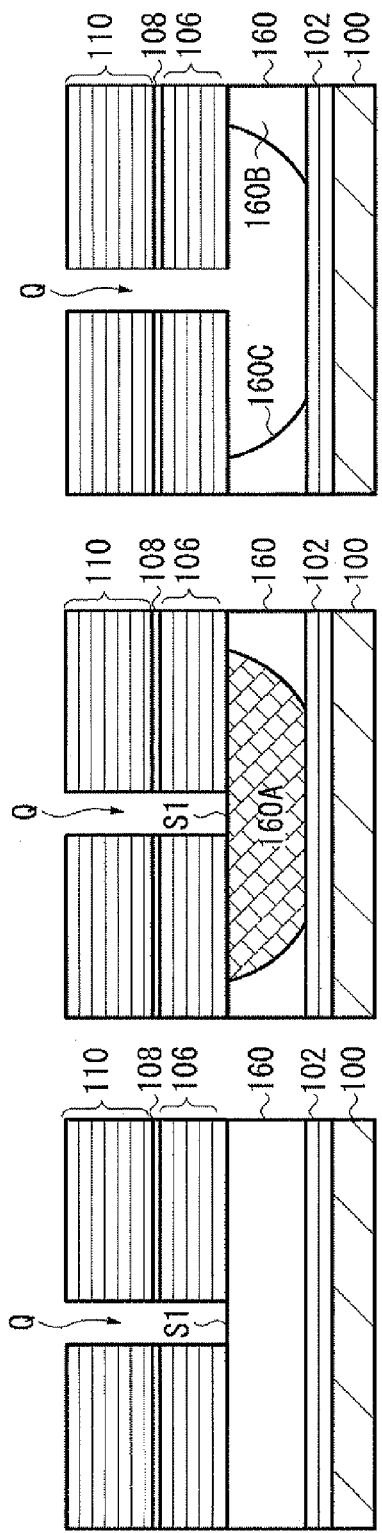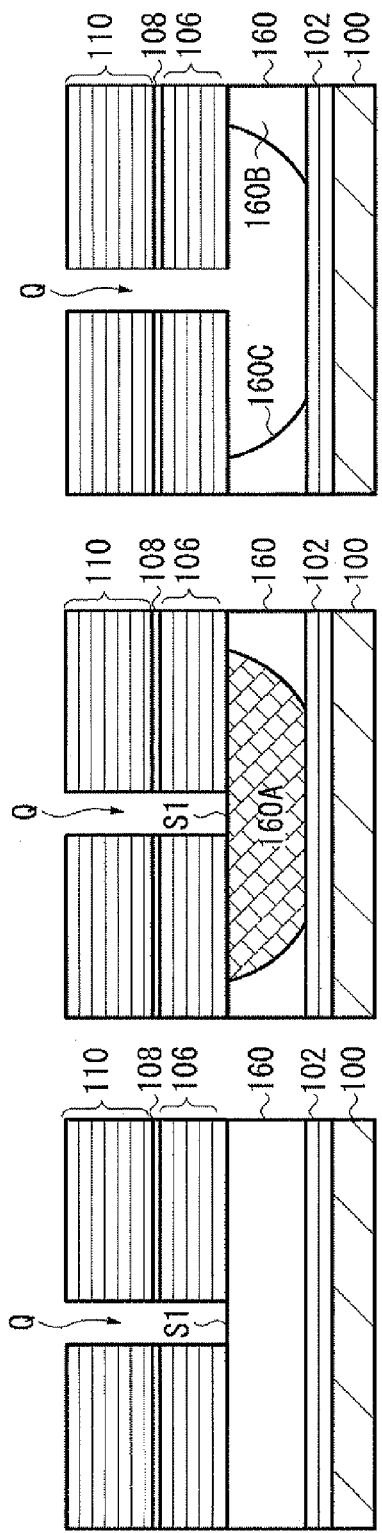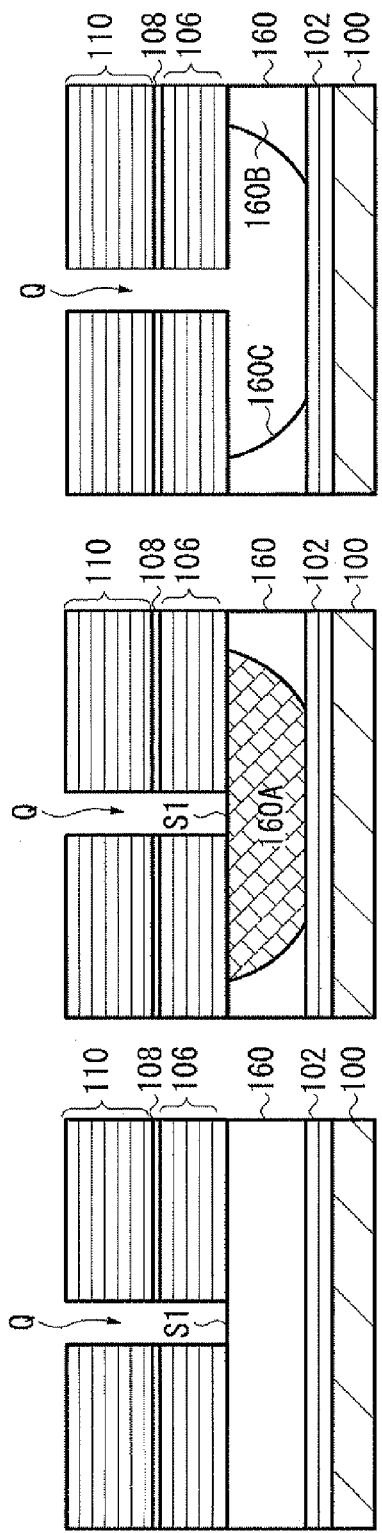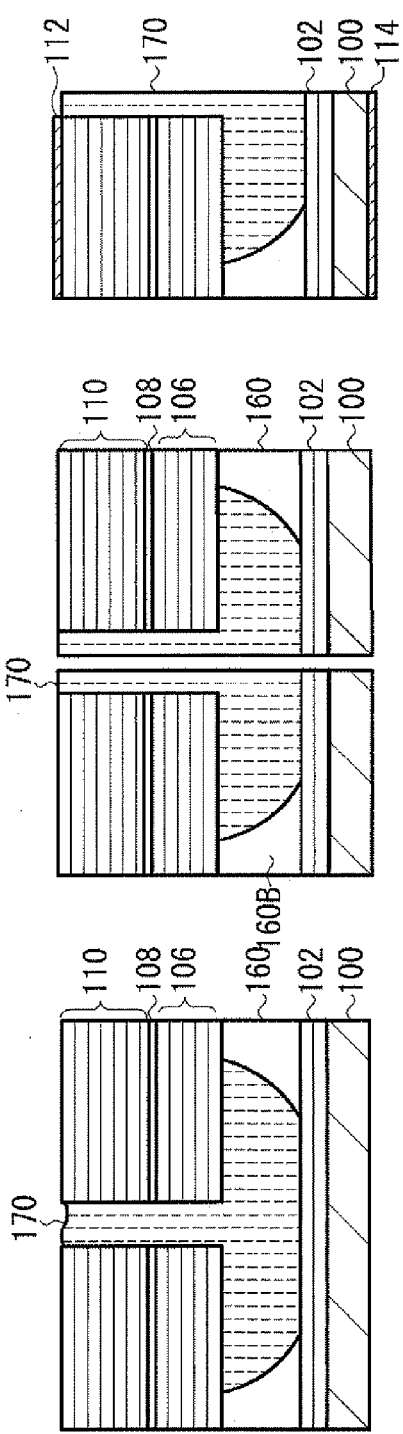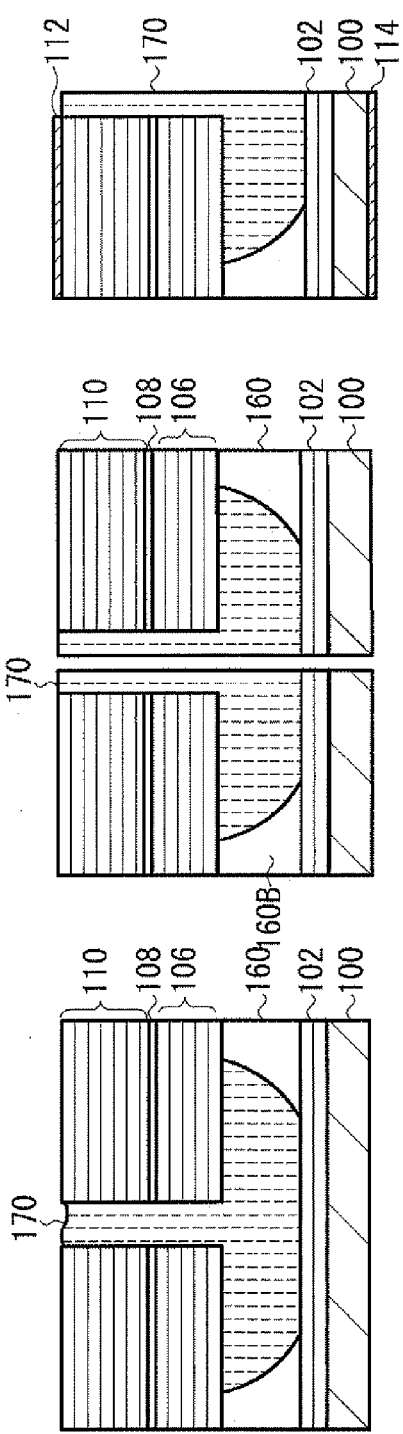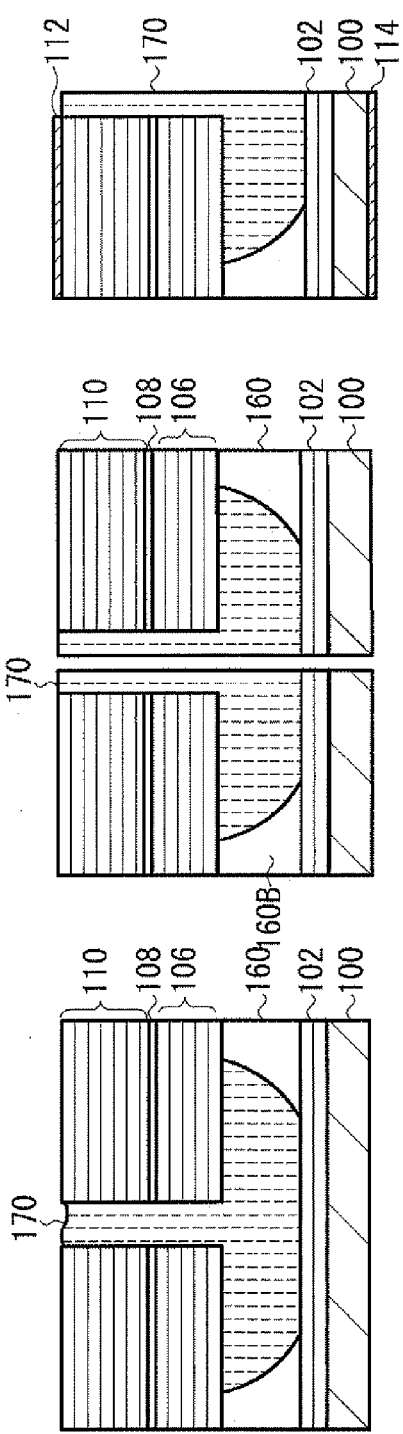

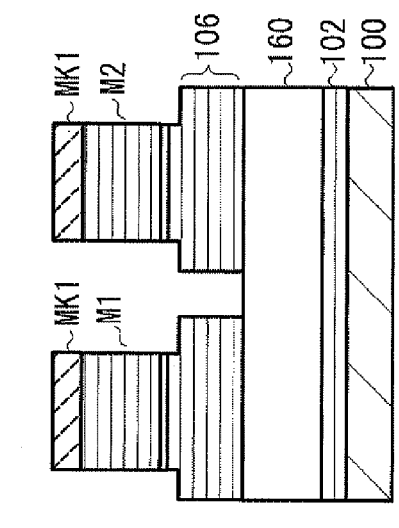
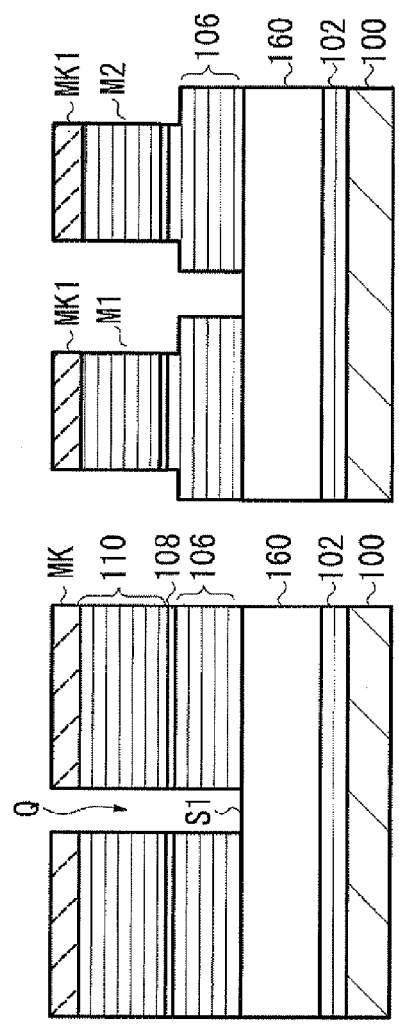
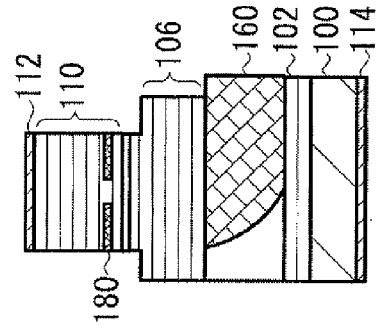
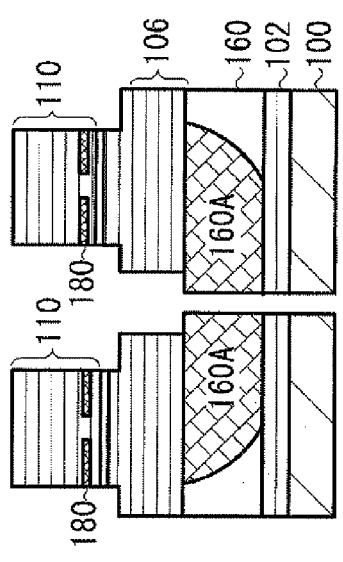
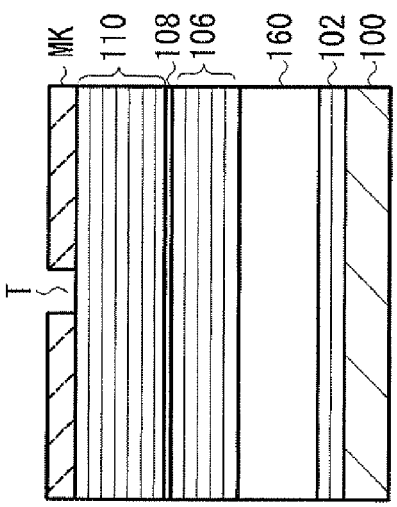
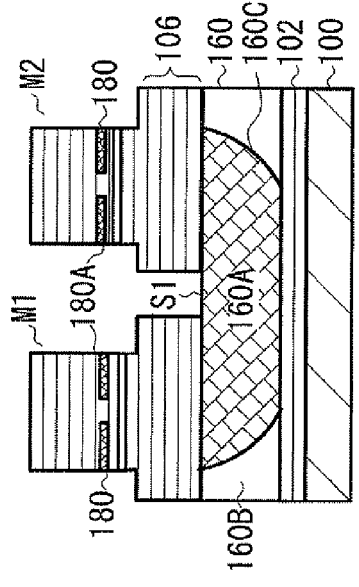

SEMICONDUCTOR LASER, SEMICONDUCTOR LASER DEVICE, AND FABRICATION METHOD OF SEMICONDUCTOR LASER

CROSS-REFERENCE TO RELATED APPLICATION

This application is based on and claims priority under 35 USC 119 from Japanese Patent Application No. 2010-052117 filed on Mar. 9, 2010.

BACKGROUND (i) Technical Field

The present invention relates to a semiconductor laser, a semiconductor laser device and a fabrication method of a semiconductor laser.

(ii) Related Art

A vertical cavity surface emitting laser (VCSEL) has advantages that its size is small, the power consumption is low, and an array is easy, and is used as a light source in a communication device and an image forming apparatus. A vertical cavity surface emitting laser makes the practical use of a high speed modulation of about 10 GBps possible, and a 100 Gbps-class high-speed and large capacity communication is expected for the future. To achieve it, a module where 10 Gbps vertical cavity surface emitting lasers, which are at practical level, are arrayed has been studied.

SUMMARY

According to an aspect of the present invention, there is provided a semiconductor laser including: a substrate; a first semiconductor multilayer reflector of a first conductive type formed on the substrate; an active region formed on the first semiconductor multilayer reflector; a second semiconductor multilayer reflector of a second conductive type formed on the active region; and an intermediate semiconductor layer of a first conductive type or a second conductive type formed under the first semiconductor multilayer reflector or above the second semiconductor multilayer reflector, wherein an oxidized region formed by oxidizing a part of the intermediate semiconductor layer and an un-oxidized region contacting with the oxidized region are formed in the intermediate semiconductor layer, the un-oxidized region is electrically connected to the first or second semiconductor multilayer reflector, and a beam generated in the active region is reflected at a boundary between the oxidized region and the un-oxidized region to a direction parallel to a principal surface of the substrate, and is emitted from a side surface of the intermediate semiconductor layer.

BRIEF DESCRIPTION OF THE DRAWINGS

Exemplary embodiments of the present invention will be described in detail based on the following figures, wherein:

FIGS. 12A through 12F are schematic cross-section views to explain a fabrication method of a semiconductor laser in accordance with the sixth exemplary embodiment of the present invention;

FIGS. 13A through 13F are schematic cross-section views to explain a fabrication method of a semiconductor laser in accordance with the seventh exemplary embodiment of the present invention; and FIGS. 14A through 14F are schematic cross-section views to explain a fabrication method of a semiconductor laser when the semiconductor laser in accordance with the sixth exemplary embodiment of the present invention has a current confining layer.

DETAILED DESCRIPTION

A description will now be given, with reference to the accompanying drawings, of exemplary embodiments of the present invention. In the following description, a semiconductor laser where a vertical resonator structure is formed by a semiconductor multilayer reflector formed by stacking multiple pairs of a semiconductor layer with a high refractive index and a semiconductor layer with a low refractive index is exemplified. The scale in drawings is exaggerated to understand the feature of the present invention, and is not same as the scale of actual devices.

First Exemplary Embodiment

Figure 1A:
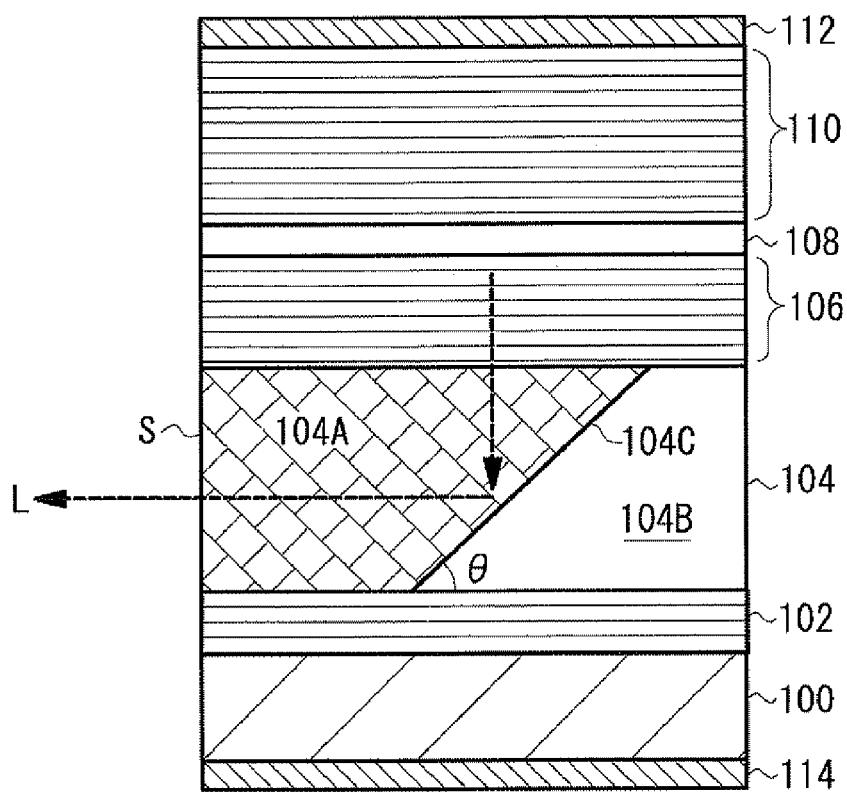
FIGS. 1A and 1B are a schematic cross-section view of a semiconductor laser in accordance with a first exemplary embodiment of the present invention.

FIG. 1A is a schematic cross-section view illustrating a structure of a semiconductor laser in accordance with a first exemplary embodiment of the present invention. As illustrated in FIG. 1A, a semiconductor laser 10 of the first exemplary embodiment is formed by stacking an n-type first lower Distributed Bragg Reflector (hereinafter, abbreviated as DBR) 102, an optical path converting layer 104 formed on the first lower DBR 102, and a n-type second lower DBR 106, an active region 108, and a p-type upper DBR 110 on an n-type GaAs substrate 100. The n-type first lower DBR 102 is formed by stacking AlGaAs layers with different Al composition alternately. The n-type second lower DBR 106 is formed by stacking AlGaAs layers with different Al composition alternately on the optical path converting layer 104. The active region 108 is formed on the second lower DBR 106, and includes a quantum well active layer sandwiched between upper and lower spacer layers. The p-type upper DBR 110 is formed by stacking AlGaAs layers with different Al composition alternately on the active region 108. A p-side electrode 112 is formed on the upper DBR 110, and an n-side electrode 114 is formed on the back of the substrate 100.

The n-type first lower DBR 102 is a multi-layer stack formed by a pair of an Al0.9Ga0.1As layer and an Al0.15Ga0.85As layer for example. The thickness of each layer is $\lambda/4n_r$ ($\lambda$ is an oscillation wavelength, and $n_r$ is a refractive index of the medium), and the pair of an $Al_{0.9}Ga_{0.1}As$ layer and an $Al_{0.15}Ga_{0.85}As$ layer is stacked several periods. The second lower DBR 106 has a same composition as the first lower DBR 102, and a pair of an $Al_{0.9}Ga_{0.1}As$ layer and an $Al_{0.15}Ga_{0.85}As$ layer is stacked 22 periods. The lower spacer layer of the active region 108 is an undoped $Al_{0.6}Ga_{0.4}As$ layer, quantum well active layers are an undoped GaAs quantum well layer and an undoped $Al_{0.3}Ga_{0.7}As$ barrier layer, and the upper spacer layer is an undoped $Al_{0.6}Ga_{0.4}As$ layer. The p-type upper DBR 110 is a multi-layer stack formed by a pair of an $Al_{0.9}Ga_{0.1}As$ layer and an $Al_{0.15}Ga_{0.85}As$ layer for example. The thickness of each layer is $\lambda/4n_r$, and the $Al_{0.9}Ga_{0.1}As$ layer and the $Al_{0.15}Ga_{0.85}As$ layer are stacked alternately 35 periods. A contact layer comprised of p-type GaAs is formed at a top layer of the upper DBR 110, and electrically connected to the p-side electrode 112.

Figure 1B:
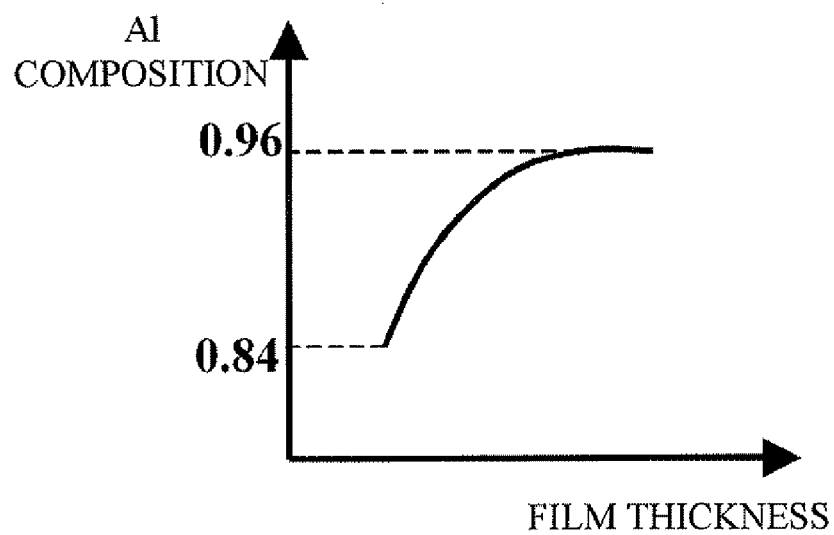

The optical path converting layer 104 is inserted between the first lower DBR 102 and the second lower DBR 106, and changes the optical path of a laser beam oscillated to a direction perpendicular to a principal surface of the substrate (an optical axis direction) to a direction parallel to the principal surface of the substrate. The optical path converting layer 104 is preferably composed of an n-type $Al_xGa_{1-x}As$ layer with a graded structure where an Al composition is changed, and the $Al_xGa_{1-x}As$ layer has a film thickness of about 10 μm. Further preferably, the Al composition of the optical path converting layer 104 is in a range between 70 and 100% ($0.7 \leq x \leq 1.0$), and becomes large as a distance from the active region 108 becomes small. In the first exemplary embodiment, the Al composition changes in a quadric manner in a range between 0.84 and 0.96 as illustrated in FIG. 1B.

An oxidized region (AlOx) 104A which is a part of AlxGa1-xAs layer oxidized and an un-oxidized region 104B which contacts with the oxidized region 104A are formed in the optical path converting layer 104. The oxidization proceeds from the exposed side surface S of the optical path converting layer 104 to the inside, and preferably, the almost half of the optical path converting layer 104 is oxidized. As the oxidation rate is proportional to the Al composition, the oxidation rate of the area close to the active region 108 is faster than that of the area far from the active region 108, and the oxidization proceeds to more inside. Therefore, a boundary 104C between the oxidized region 104A and the un-oxidized region 104E is linearly inclined by making the Al composition of the optical path converting layer 104 change in a quadric manner. As one preferable example, changes of the film thickness and the Al composition of the optical path converting layer 104 are selected so that the inclined angle θ of the boundary 104C to the principal surface of the substrate 100 becomes 45 degrees. The un-oxidized region 104B is an n-type conductive region, and connects the first lower DBR 102 and the second lower DBR 106 electrically.

In the first exemplary embodiment, the refractive index of the oxidized region 104A is about 1.5, and the refractive index of the un-oxidized region 104B is about 3. A laser beam with a wavelength of 850 nm generated in the active region 108 enters the optical path converting layer 104 from the optical axis direction, is reflected by the boundary 104C to the horizontal direction, and is emitted outside from the side surface S. The refractive index of the boundary 104C, which functions as, a reflection surface is about 20% in the wavelength of 850 nm. In the semiconductor laser of the present exemplary embodiment, as the laser beam which is resonated to a direction perpendicular to the substrate is emitted after its optical path is changed to the horizontal direction, it becomes possible to arrange an optical transmission member such as an optical fiber closely in the lateral direction of the semiconductor laser. In addition, it becomes possible to make the height of whole structure lower by arranging an optical fiber on the lateral side of the semiconductor laser.

The laser beam with an oscillation wavelength of 850 nm generated in the active region 108 is resonated by a vertical resonators in the second lower DBR 106 and the upper DBR 110. As the number of pairs of the second lower DBR 106 is less than that of the upper DBR 110, and a reflection ratio becomes small, the resonated laser beam L enters the optical path converting layer 104 from the optical axis direction, reflected at the boundary 104C to the direction substantially parallel to the principal surface of the substrate, transmitted through the oxidized region 104A, and emitted outside from the side surface S of the optical path converting layer 104 finally. As the first lower DBR 102 is formed on the bottom side of the optical path converting layer 104, the laser beam L is guided properly by the first and second lower DBRs 102 and 106, and emitted from the side surface S even though the reflection angle at the boundary 104C varies. The first lower DBR 102 is not an essential structure for the optical path conversion. The reflection at the boundary 104C of the optical path converting layer 104 is enough for the entering beam from the optical axis direction. In this case, the optical path converting layer 104 may be formed directly on the substrate 100, and the un-oxidized region 104B may be electrically connected to the substrate 100.

Second Exemplary Embodiment

Figure 2:
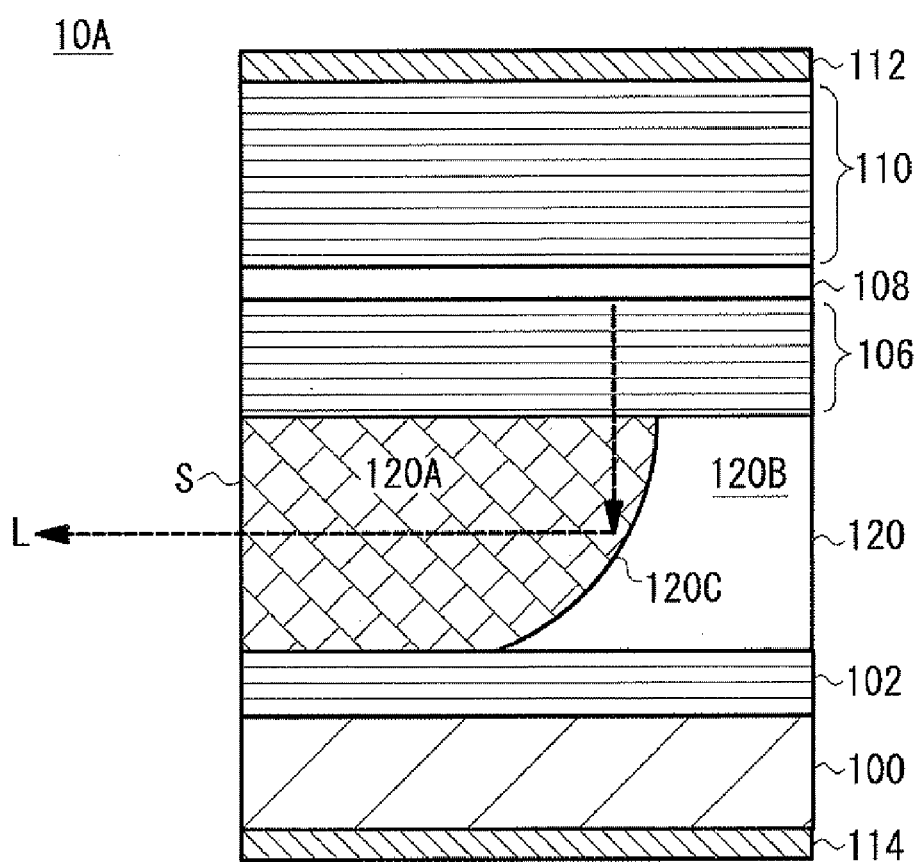
FIG. 2 is a schematic cross-section view of a semiconductor laser in accordance with a second exemplary embodiment of the present invention.

A description will now be given of a second exemplary embodiment with reference to FIG. 2. A semiconductor laser 10A in accordance with the second exemplary embodiment is different from the first exemplary embodiment in that a boundary 120C between an oxidized region 120A and an un-oxidized region 120B of an optical path converting layer 120 has a curved surface or a spherical surface. In FIG. 2, same reference numerals are used for same structures as those of the first exemplary embodiment.

In the second exemplary embodiment, the optical path converting layer 120 is composed of an n-type AlxGa1-xAs layer with a graded structure where the Al composition is changed. The Al composition changes in a range between 0.7 and 1.0, and becomes large linearly or gradually as the distance from the active region 108 becomes small. When the Al composition is changed linearly, the oxidation rate at the region with a high Al composition becomes relatively fast in a case that the oxidation proceeds from the exposed side surface S of the optical path converting layer 120, and the oxidation in response to the change of the Al composition is carried out. Therefore, when the Al composition is changed linearly or gradually, it is possible to make boundary 120C between the oxidized region 120A and the un-oxidized region 120B which contacts with the oxidized region 120A have a substantially curved surface or a substantially spherical surface. The beam generated in the active region 108 is resonated between the second lower DBR 106 and the upper DBR 110, and the resonated laser beam L is emitted outside from the side surface S after its optical path is changed to the horizontal direction at the optical path converting layer 120. In the second exemplary embodiment, the laser beam is reflected to be focused by making the reflective surface of the boundary 120C concave.

Third Exemplary Embodiment

Figure 3:
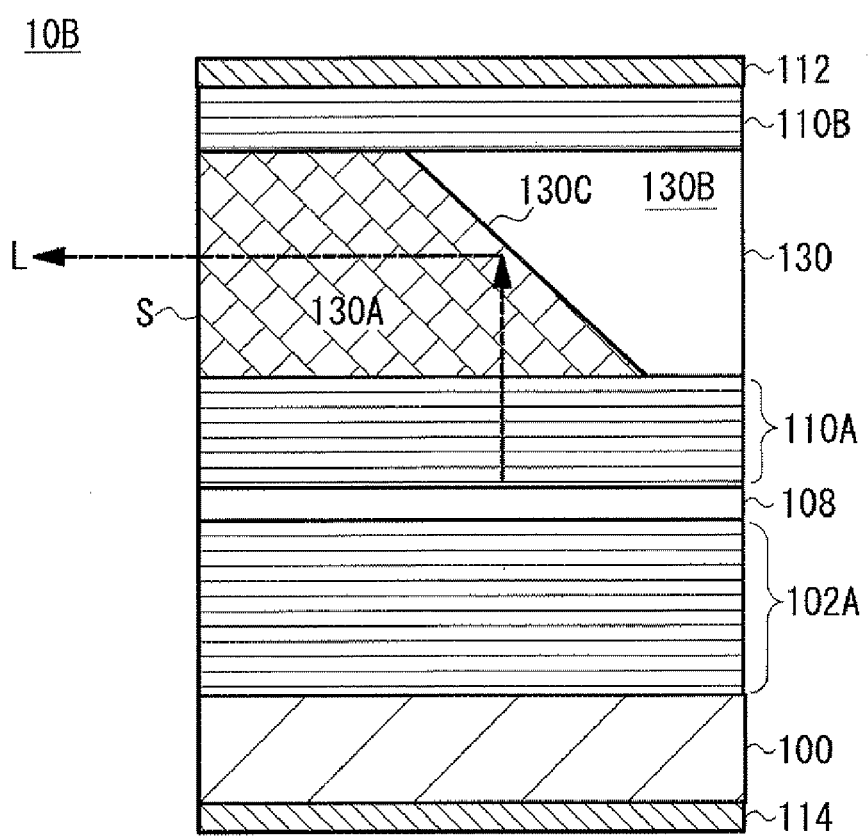
FIG. 3 is a schematic cross-section view of a semiconductor laser in accordance with a third exemplary embodiment of the present invention.

A description will now be given of a third exemplary embodiment with reference to FIG. 3. A semiconductor laser 10B in accordance with the third exemplary embodiment has a structure where an optical path converting layer 130 is inserted in the upper DBR. As illustrated in FIG. 3, the semiconductor laser 10B of the third exemplary embodiment is formed by stacking an n-type lower DBR 102A, the active region 108, a p-type first upper DBR 110A, the optical path converting layer 130 composed of p-type AlGaAs, and a p-type second upper DBR 110B on the n-type GaAs substrate 100.

The lower DBR 102A is formed by stacking AlGaAs layers with different Al composition 36 periods, the first upper DBR 110A is formed by stacking AlGaAs layers with different Al composition 20 periods, and the second upper DBR 110B is formed by stacking AlGaAs layers with different Al composition several periods. The optical path converting layer 130 is composed of a p-type $Al_xGa_{1-x}As$ layer with a graded structure where the Al composition is change. The Al composition increases as a distance from the active region 108 becomes small, and in this exemplary embodiment, the Al composition changes in a quadric manner. Accordingly, the optical path converting layer 130 makes a boundary 130C between an oxidized region 130A and an un-oxidized region 130B a tapered shape as in the first exemplary embodiment. The un-oxidized region 130B electrically connects the second upper DBR 110B and the first upper DBR 110A.

The laser beam L generated in the active region 108 is resonated between the lower DBR 102A and the first upper DBR 110A, enters the optical path converting layer 130 from the first upper DBR 110A, and is reflected at the boundary 130C to a substantially orthogonal direction. The reflected laser beam L is transmitted through the oxidized region 130A, and emitted outside from the side surface of the optical path converting layer 130 finally. As the second upper DBR 110B is formed on the top surface of the optical path converting layer 130, the laser beam L is guided properly by the first and second upper DBRs 110A and 110B, and is emitted from the side surface S even though the reflection angle at the boundary 130C varies. The second upper DBR 110B is not an essential structure. The reflection at the boundary 130C of the optical path converting layer 130 is enough for the entering beam from the optical axis direction. In this case, the p-side electrode 112 may be formed directly on the optical path converting layer 130, and the un-oxidized region 130B may be electrically connected to the p-side electrode 112.

According to the third exemplary embodiment, as the optical path converting layer 130 is formed on the active region 108, it becomes easy to expose the side surface S of the optical path converting layer 130 compared to the first and second exemplary embodiments, and the process can become easy. The Al composition of the optical path converting layer 130 may be changed linearly or gradually in the same manner as the second exemplary embodiment, and the boundary 120C may have a curved surface or a spherical surface.

Fourth Exemplary Embodiment

Figure 4:
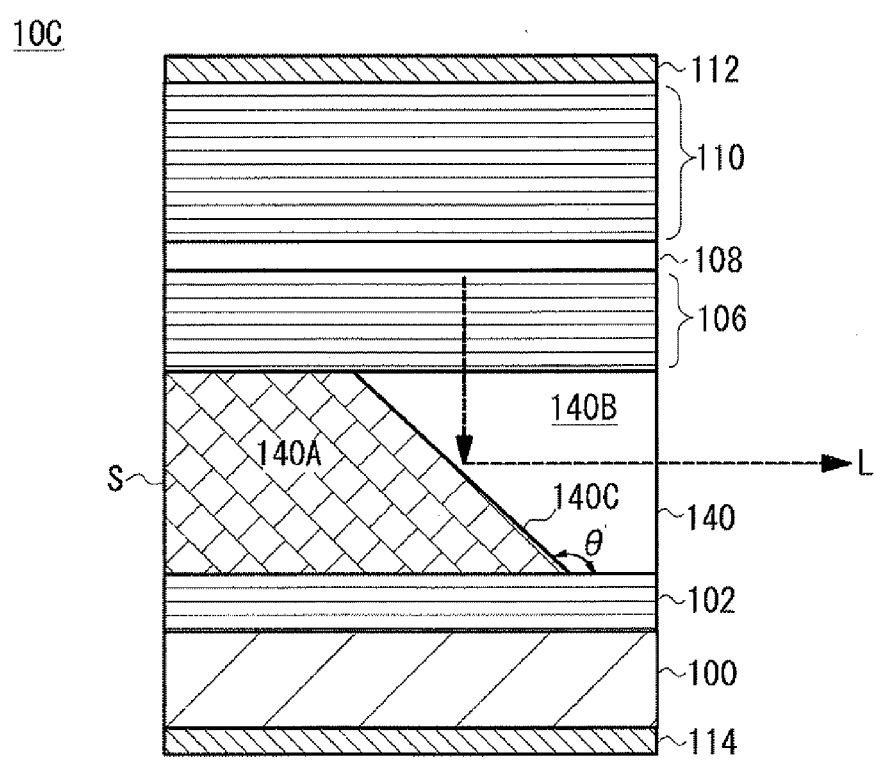
FIG. 4 is a schematic cross-section view of a semiconductor laser in accordance with a fourth exemplary embodiment of the present invention.

A description will now be given of a fourth exemplary embodiment with reference to FIG. 4. A semiconductor laser 10C in accordance with the fourth embodiment is similar to the semiconductor laser 10 of the first exemplary embodiment, but the change of the Al composition of an optical path converting layer 140 is different. In the optical path converting layer 140, the Al composition is in a range between 70 and 100%, and becomes small as the distance from the active region 108 becomes small. The Al composition may be changed linearly or in a quadric manner. In this exemplary embodiment, the Al composition is changed in a quadric manner.

When the optical path converting layer 140 with such a change of the Al composition is oxidized, as the oxidation rate from the side surface S responds to the change of the Al composition, a boundary 140C between an oxidized region 140A and an un-oxidized region 140B is line symmetry to the boundary 104C in the first exemplary embodiment. When the inclined angle θ of the boundary 104C of the first exemplary embodiment is 45 degrees, the inclined angle θ of the boundary 140C of the second exemplary embodiment becomes 135 degrees, and the direction to which the laser beam L is reflected is reversed.

When the inclined angle θ of the boundary 140C is 135 degrees and the laser beam L from the optical axis direction enters the optical path converting layer 140 at the entering angle of 45 degrees, the laser beam L is totally reflected at the boundary 140C, is transmitted through the un-oxidized region 140B, and is emitted outside from the side surface opposite to the side surface S of the optical path converting layer 140. According to the fourth exemplary embodiment, it is possible to make the reflection ratio of the boundary 140C large.

Fifth Exemplary Embodiment

Figure 5:
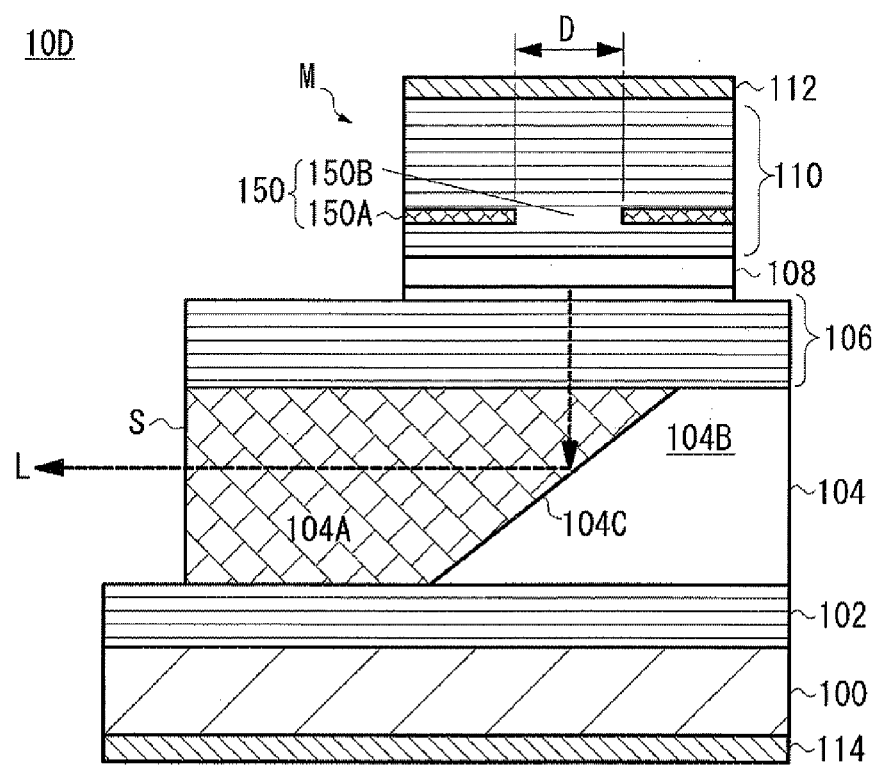
FIG. 5 is a schematic cross-section view of a semiconductor laser in accordance with a fifth exemplary embodiment of the present invention.

A description will now be given of a fifth exemplary embodiment with reference to FIG. 5. A semiconductor laser 10D in accordance with the fifth exemplary embodiment exemplifies a semiconductor laser including an selective oxidization type current confining layer. As illustrated in FIG. 5, the semiconductor laser 10D forms a cylindrical mesa (a columnar structure) M on the substrate by etching a semiconductor layer from the upper DBR 110 to the second lower DBR 106. In the upper DBR 110, a current confining layer 150 composed of p-type AlAs or AlGaAs is formed, and the current confining layer 150 includes a circular oxidized region 150A which is selectively oxidized from the exposed side surface in the mesa M, and a conductive oxidized aperture 150B surrounded by the oxidized region 150A. The oxidized aperture 150B has a circular shape which reflects the outer shape of the mesa M, and its diameter D is set to be equal to or less than 5 μm when the basic lateral mode is required, and is set to be more than 5 μm when the multi mode is required. The boundary 104C of the optical path converting layer 104 is provided on the optical axis which is the center of the oxidized aperture 150B.

When the driving current to the forward direction is applied between the p-side electrode 112 and the n-side electrode 114, the carrier is confined by the oxidized aperture of the current confining layer 150, and injected in to the active region 108 efficiently. As the current confining layer 150 also confines a beam by the oxidized region 150A, the laser beam L generated in the active region 108 is resonated in the oxidized aperture 150B, and the resonated laser beam L is reflected by the boundary 104C of the optical path converting layer 104 to the direction perpendicular to the optical axis, and is emitted outside from the side surface S of the optical path converting layer 104.

Sixth Exemplary Embodiment

Figure 6:
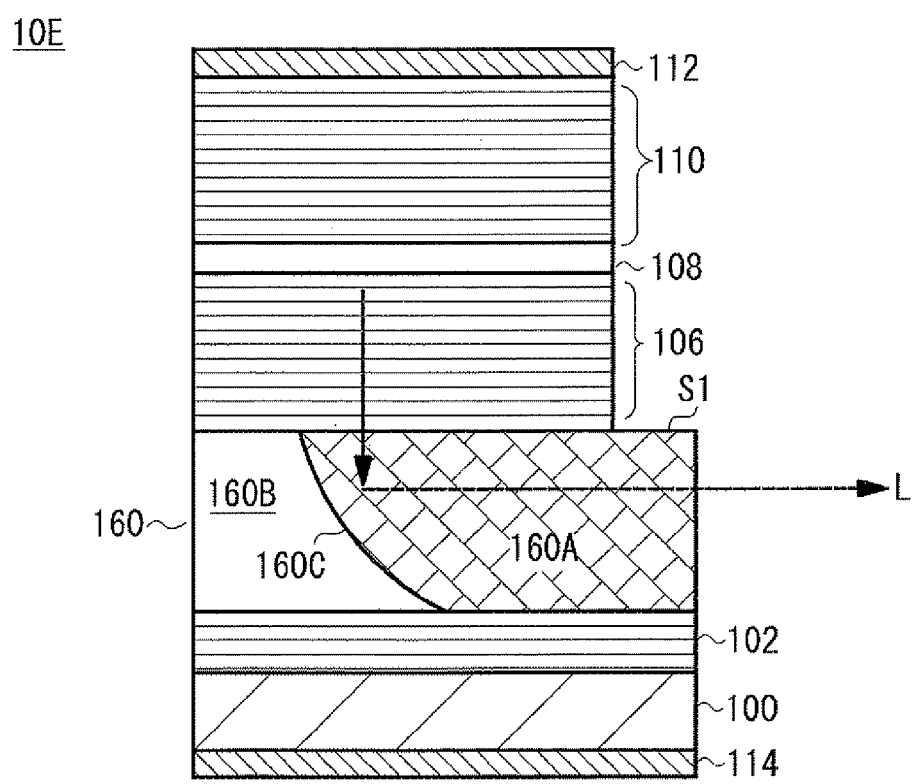
FIG. 6 is a schematic cross-section view of a semiconductor laser in accordance with a sixth exemplary embodiment of the present invention.

A description will now be given of a sixth exemplary embodiment with reference to FIG. 6. A semiconductor laser 10E in accordance with the sixth exemplary embodiment has a similar structure to that of the first and second exemplary embodiment, but the Al composition of an optical path converting layer 160 ($Al_xGa_{1-x}As$) is uniform. Preferably, the Al composition of the optical path converting layer 160 is larger the Al composition of AlGaAs, of which the Al composition is relatively high, comprising the first and second lower DBRs 102 and 106 and the upper DBR 110.

In the sixth exemplary embodiment, a groove from the upper DBR 110 to the second lower DBR 106 is formed by etching, a surface S1 of the optical path converting layer 160 is exposed by the groove, and the optical path converting layer 160 is selectively oxidized from the surface S1. The surface S1 may be slightly concaved by the etching for fanning the groove. As the Al composition of the optical path converting layer 160 is uniform, the oxidation isotropically proceeds from the surface S1 to the inside at a constant oxidation rate. The oxidation is carried out until an oxidized region 160A attains the film thickness of the optical path converting layer 160, and a curved boundary 160C is formed between the oxidized region 160A and an un-oxidized region 160B. As described above, the optical path of the laser beam L resonated by the vertical resonator is changed to the horizontal direction at the boundary 160C.

Seventh Exemplary Embodiment

Figure 7:
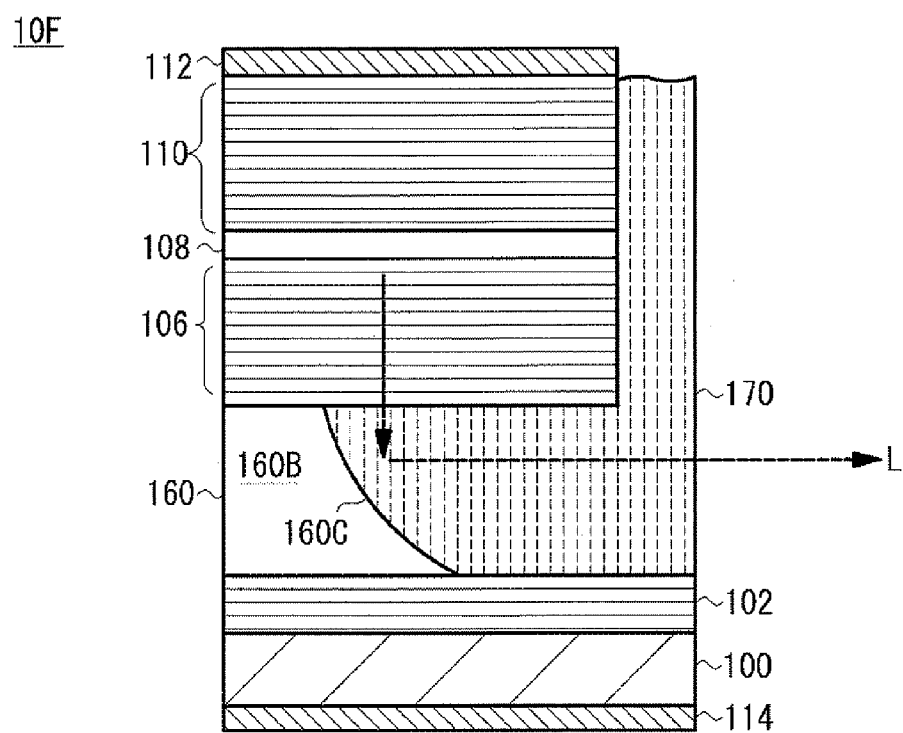
FIG. 7 is a schematic cross-section view of a semiconductor laser in accordance with a seventh exemplary embodiment of the present invention.

A description will now be given of a second exemplary embodiment with a reference to FIG. 7. A semiconductor laser 10F of the seventh exemplary embodiment is formed by removing the oxidized region 160A of the optical path converting layer 160 formed by the sixth exemplary embodiment with an etching solution such as buffered hydrofluoric acid, filling the cavity with a flowable light transmissive material 170, and curing the material 170. For example, a polymide resin having fluidity and light transparency may be filled and cured. A refractive index deference from the un-oxidized region 160B can be adjusted by selecting a refractive index of the filled material 170 arbitrary, and it becomes possible to change the reflection ratio at the boundary 160C.

Eighth Exemplary Embodiment

Figure 8A:
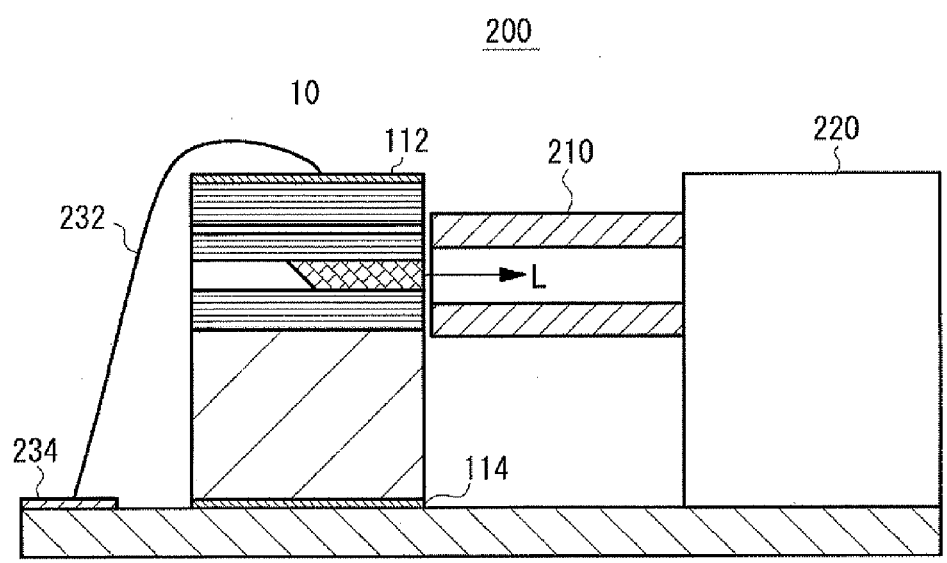
FIG. 8A is a schematic cross-section view of an optical transmission device in accordance with an exemplary embodiment of the present invention.
Figure 8B:
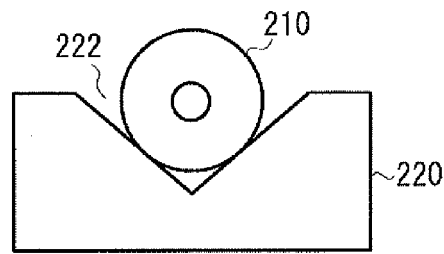
FIG. 8B is a front view of an optical wiring fix part.

A description will now be given of an eighth exemplary embodiment with reference to FIGS. 8A and 8B. FIG. 8A illustrates a cross-section structure of an optical transmission device (an optical transmission module) to which the semiconductor laser in accordance with first through seventh exemplary embodiments is packaged. In this exemplary embodiment, a description will be given by using the semiconductor laser 10 of the first exemplary embodiment as an example. An optical transmission device 200 in accordance with the present exemplary embodiment is provided with the semiconductor laser 10, an optical wiring 210 which is located on the lateral side of the semiconductor laser 10 and transmits a laser beam emitted from the semiconductor laser, an optical wiring fixing portion 220 fixing the optical wiring, and a circuit substrate 230 to which the semiconductor laser and the optical wiring fixing portion 220 are installed.

The n-side electrode 114 of the semiconductor laser 10 is connected to the designated metallic wiring on the circuit substrate 230 by using a bonding material such as solder, and the p-side electrode 112 is connected to a metallic wiring 234 by a bonding wire 232. The optical wiring 210 is composed of an optical fiber, an optical waveguide, or the like, and here the cylindrical optical fiber is illustrated. A V-shaped groove 222 is formed on the surface of the optical wiring fixing portion 220 as illustrated in FIG. 8B, and one end of the cylindrical optical wiring 210 is supported in the V-shaped groove 222. The other end of the optical wiring 210 is arranged close to the side surface of the optical path converting layer 104 of the semiconductor laser 10. Accordingly, the laser beam L emitted to the horizontal direction from the side surface of the optical path converting layer 104 directly enters the core in the optical wiring 210.

According to the optical transmission device 200 of the present exemplary embodiment, as it is possible to arrange the optical wiring 210 on the lateral side of the semiconductor laser 10 on the circuit substrate 230, the optical wiring 210 can be arranged close to the semiconductor laser 10 without being affected by the bonding wire 232, and the direct optical connection can be achieved without arranging an optical member such as a lens between the semiconductor laser 10 and the optical wiring 210. Furthermore, it is possible to make the height of the optical transmission device 200 lower by arranging the optical wiring 210 next to the semiconductor laser 10.

Figure 9:
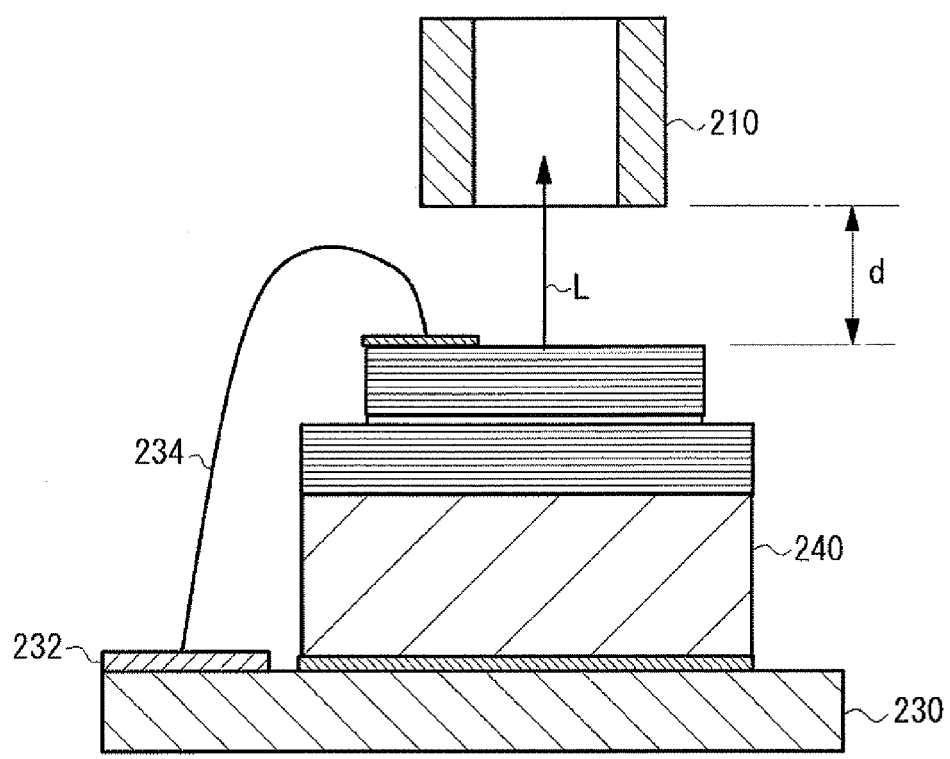
FIG. 9 is a schematic cross-section view of an optical transmission device when using a typical VCSEL.

FIG. 9 illustrates a composition of a typical optical transmission device when a VCSEL 240 which emits a beam from its top is used. As illustrated in FIG. 9, the p-side electrode of the VCSEL 240 is connected to the metallic wiring 234 by the bonding wire 232, but the optical wiring 210 is arranged having a large gap d from the top of the VCSEL 240 to avoid the interference with the bonding wire 232. Thus, it becomes difficult to make the height of the optical transmission device lower. When the gap d becomes large, it becomes necessary to arrange a focusing lens for making a beam enter the optical wiring 210 efficiently. This leads the increase of the number of components, and prevents the cost reduction.

The optical transmission device illustrated in FIG. 8A illustrates a relation between a single semiconductor laser and a single optical wiring, but arrayed semiconductor lasers can be packaged on the circuit substrate to achieve 100 Gbps high-speed modulation. In this case, multiple optical wirings are arranged to correspond with multiple semiconductor lasers respectively.

Figure 10A:
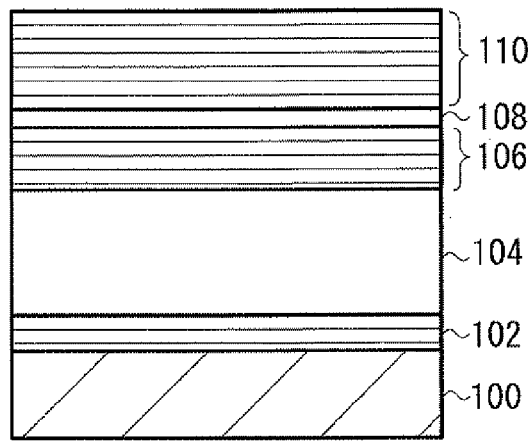
FIGS. 10A through 10C are schematic cross-section views to explain a fabrication method of a semiconductor laser in accordance with the first through fourth exemplary embodiments of the present invention.
Figure 10B:
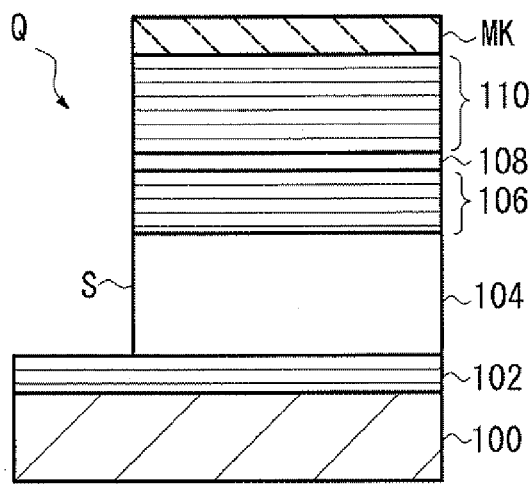
Figure 10C:
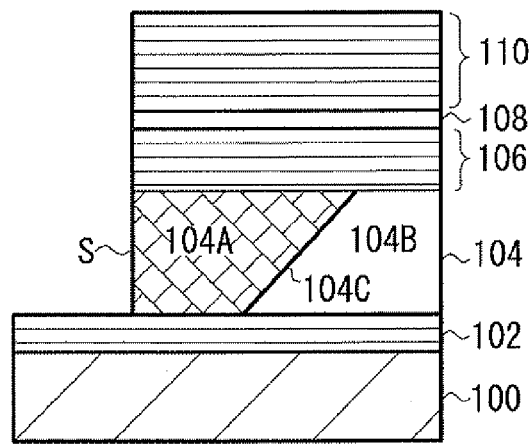

A description will now be given of a fabrication method of the semiconductor laser in accordance with the first exemplary embodiment of the present invention, with reference to FIGS. 10A through 10C. As illustrated in FIG. 10A, the n-type first lower DBR 102, the optical path converting layer 104, the n-type second lower DBR 106, the active region 108, and the p-type upper DBR 110 are formed on the GaAs substrate 100 by the metal organic chemical vapor deposition (MOCVD) method. The n-type first lower DBR 102 is formed by stacking $Al_{0.9}Ga_{0.1}As$ and $Al_{0.15}Ga_{0.85}As$ with a carrier concentration of $1\times10^{18}$ $cm^{-3}$ alternately 3 periods so that each film thickness becomes quarter of the wavelength of the medium. The optical path converting layer 104 is composed of n-type $Al_xGa_{1-x}As$ ($0.7 \leq x \leq 1.0$) with a graded structure, and has a carrier concentration of $1\times10^{18}$ $cm^{-3}$ and a film thickness of about 10 μm. The n-type second lower DBR 106 is formed by stacking $Al_{0.9}Ga_{0.1}As$ and $Al_{0.15}Ga_{0.85}As$ with a carrier concentration of $1\times10^{18}$ cm$^{-3}$ alternately 22 periods so that each film thickness becomes quarter of the wavelength of the medium. The active region 108 is composed of an undoped lower $Al_{0.6}Ga_{0.4}As$ spacer layer, an undoped quantum well active layer which is composed of three GaAs quantum well layers with a film thickness of 7 nm and four $Al_{0.3}Ga_{0.7}As$ barrier layers with a film thickness of 8 nm, and an undoped upper $Al_{0.6}Ga_{0.4}As$ spacer layer, and its film thickness is a wavelength of the medium. The p-type upper DBR 110 is formed by stacking $Al_{0.9}Ga_{0.1}As$ and $Al_{0.15}Ga_{0.85}As$ with a carrier concentration of $1\times10^{18}$ cm$^{-3}$ alternately 35 periods so that each film thickness becomes quarter of the wavelength of the medium. The top layer of the upper DBR 110 is a p-type GaAs contact layer with a carrier concentration of $1\times10^{18}$ cm$^{-3}$.

Then, a mask MK is formed by a conventional photolithography process, and a groove Q is formed to expose the side surface of the optical path converting layer 104 by an anisotropic etching of the semiconductor layer exposed by the mask MK. The planar shape of the groove Q is a rectangular shape for example. After removing the mask MK, as illustrated in FIG. 10C, the oxidation process at a constant temperature for a given time is carried out. The side surface S of the optical path converting layer 104 is completely exposed, the oxidation proceeds from the side surface S to the inside. At this time, as the Al composition increases in the quadric manner as a distance from the active region 108 becomes small, the oxidation rate of the area close to the active region 108 becomes faster, and the boundary 104C of which the shape is a tapered shape as illustrated in FIG. 10C is formed. When the oxidized region 104A becomes too large, the un-oxidized region 104B becomes small and the electric resistance increases. Thus, preferably, the oxidized region 104A is almost a half of the optical path converting layer 104.

Then, the p-side electrode comprised of Au or stack of Au/Ti is formed on the upper DBR 110 by a liftoff process, and the n-side electrode 114 is formed on the back of the substrate. A beam aperture, which exists in a typical VCSEL, is not formed in the p-side electrode 112. The VCSELs in accordance with the second through fourth exemplary embodiments are fabricated in the same manner.

A description will now be given of a fabrication method of the semiconductor laser 10D in accordance with the fifth exemplary embodiment with reference to FIGS. 11A through 11C. As illustrated in FIG. 10A, the first lower DBR 102, the optical path converting layer 104, the second lower DBR 106, the active region 108, and the upper DBR 110 are sequentially stacked on the substrate 100. The current confining layer 150 composed of AlAs or AlGaAs of which the Al composition is higher than that of DBRs) is inserted to the bottom layer of the upper DBR 110 or the location close to the active region 108.

Figure 11A:
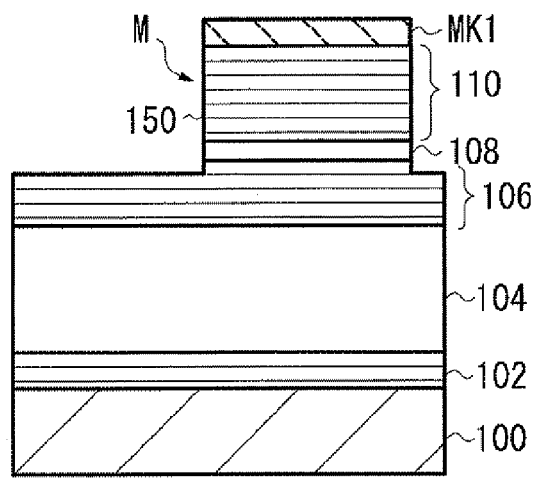
FIGS. 11A through 11C are schematic cross-section views to explain a fabrication method of a semiconductor laser in accordance with the fifth exemplary embodiment of the present invention.
Figure 11B:
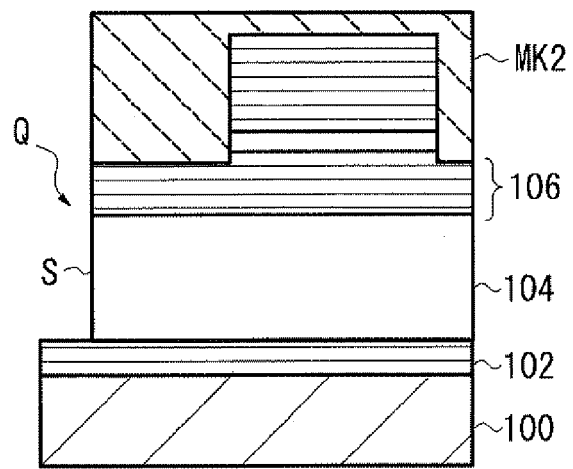
Figure 11C:
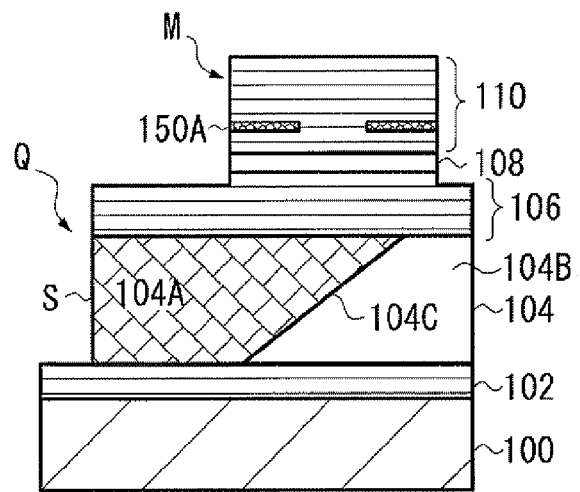

Then, as illustrated in FIG. 11A, the circular mask MK1 is formed on the upper DBR 110, and the cylindrical mesa (columnar structure) M reaching to the second lower DBR 106 is formed by an anisotropic etching of the semiconductor layer exposed by the mask MK1. After removing the mask MK1, as illustrated in FIG. 11B, a mask MK2 covering the mesa M is formed, and the second lower DBR 106 exposed by the mask MK2 is removed by the etching, and the groove Q reaching to the first lower DBR 102 is formed. The side surface S of the optical path converting layer 104 is completely exposed by the groove Q. The planar shape of the groove Q may be a rectangular shape or a circular shape.

Then the oxidation process is carried out. The optical path converting layer 104 and the current confining layer 150 are oxidized simultaneously, and the oxidized regions 104A and 150A are formed respectively. An oxidation time, an oxidation temperature, an Al composition and a film thickness are adjusted arbitrary so that the boundary 104C of the oxidized region 104A of the optical path converting layer 104 exists in the optical axis direction of the oxidized aperture (conductive region) surrounded by the oxidized region 150A of the current confining layer 150. Then the p-side electrode 112 is formed on the upper DBR 110, and the n-side electrode 114 is formed on the back of the substrate.

A description will now be given of the fabrication method of the semiconductor laser in accordance with the sixth exemplary embodiment with reference to FIGS. 12A through 12F. As described in FIG. 10A, the first lower DBR 102, the optical path converting layer 160, the second lower DBR 106, the active region 108, and the upper DBR 110 are formed on the substrate. The optical path converting layer 160 is composed of the AlGaAs of which the Al composition is uniform. Then as illustrated in FIG. 12A, the mask MK is formed on the upper DBR 110 by a photolithography process. An rectangular opening T is formed in the mask MK in the plane view.

Then, as illustrated in FIG. 12B, the groove Q to expose at least the surface S1 of the optical path converting layer 160 is formed by the anisotropic etching of the upper DBR 110 exposed by the opening T of the mask MK. The surface S1 can be over etched slightly by the groove Q. After removing the mask MK as illustrated in FIG. 12C, a selective oxidation of the optical path converting layer 160 is carried out with controlling an oxidation time and an oxidation temperature. The oxidation proceeds isotropically from the exposed surface S1 of the optical path converting layer 160 to the inside. When the oxidation for a given time is finished, the boundary 160C between the oxidized region 160A and the un-oxidized region 160B becomes curved.

Then, the optical path converting layer 160 and the substrate 100 are diced through the groove Q, and divided into two semiconductor laser elements as illustrated in FIG. 12E. The p-side electrode 112 and the n-side electrode 114 are formed on the divided semiconductor laser as illustrated in FIG. 12F. According to the fabrication method of the present exemplary embodiment, the productivity of the semiconductor laser is improved by forming the optical path converting layers of two elements simultaneously by the oxidation from one groove Q.

A description will now be given of the fabrication method of the semiconductor laser in accordance with the seventh exemplary embodiment with reference to FIGS. 13A through 13F. As illustrated in FIG. 13A and FIG. 13B, the processes till the selective oxidation of the optical path converting layer 160 are same as those of the fabrication method of the sixth exemplary embodiment described in FIGS. 12A through 12D. Then as illustrated in FIG. 13C, the oxidized region 160A of the optical path converting layer 160 is etched by using a buffered hydrofluoric acid solution through the groove Q. This forms a cavity reflecting the oxidized region 160A in the optical path converting layer 160. Then, as illustrated in FIG. 13D, a flowable light transmissive material 170 is poured into the cavity and fills the cavity in the optical path converting layer 160. The material 170 is a polymide resin for example. As illustrated in FIG. 13E, after the filled material is cured, a dicing is carried out from the center of the material 170, and the element is divided into two. Then, as illustrated in FIG. 13F, the p-side electrode 112 and the n-side electrode 114 are formed in the divided semiconductor laser. NA (number of aperture) of the emitting surface of the semiconductor laser and the reflection ratio of the boundary 160C can be adjusted by selecting the filled material 170.

A description will now be given of the fabrication method when the semiconductor laser in accordance with the sixth exemplary embodiment has a current confining layer with reference to FIGS. 14A through 14F. As illustrated in FIG. 14A and FIG. 14B, the processes till forming the groove Q reaching to the surface S1 of the optical path converting layer 160 are same as those of the sixth exemplary embodiment described in FIGS. 12A and 12B. A precursor of the current confining layer composed of AlAs or AlGaAs with a high Al composition is inserted to the upper DBR 110.

After removing the mask MK illustrated in FIG. 14B, circular masks MK1 are formed on upper DBRs 110, which are divided by the groove Q, respectively. Two mesas M1 and M2 are formed on the substrate by forming a groove which reaches to the second lower DBR 106 by the anisotropic etching with the mask MK1.

After removing the mask MK1, as illustrated in FIG. 14D, the optical path converting layer 160 and a current confining layer 180 are selectively oxidized simultaneously. In the optical path converting layer 160, the oxidation proceeding isotropically from the surface S1 exposed by the groove Q to the inside is carried out. In the current confining layer 180, the oxidation proceeding from the side surfaces of the mesas M1 and M2 to the inside is carried out. When the oxidation is finished, the oxidized region 160A, which has the curved boundary 160C, is formed in the optical path converting layer 160. A circular oxidized aperture surrounded by a circular oxidized region 180A is formed in the current confining layer 180. The diameter of the oxidized aperture is determined in response to the required multi mode or basic lateral mode. Then, as illustrated in FIG. 14E, the substrate is diced through the groove Q, and divided into two elements. Then the p-side electrode 112 and the n-side electrode 114 are formed on each as illustrated in FIG. 14F.

In above exemplary embodiments, the description was given of a GaAs-based semiconductor laser, but the present invention can be applied to other semiconductor laser using other III-V group compound semiconductors. Furthermore, a semiconductor material that is capable of epitaxial growth on the substrate, is light transmissive and conductive, and can be oxidized, and of which a refractive index is changed by the oxidation can be used for the optical path converting layer.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A semiconductor laser comprising:
   a substrate;
   a first semiconductor multilayer reflector of a first conductive type formed on the substrate;
   an active region formed on the first semiconductor multilayer reflector;
   a second semiconductor multilayer reflector of a second conductive type formed on the active region;
   a third semiconductor multilayer reflector of a first conductive type or a second conductive type on the substrate; and
   an intermediate semiconductor layer of a first conductive type or a second conductive type formed between the first semiconductor multilayer reflector and the third semiconductor multilayer reflector, or between the second semiconductor multilayer reflector and the third semiconductor multilayer reflector;
   wherein an oxidized region formed by oxidizing a part of the intermediate semiconductor layer and an un-oxidized region contacting with the oxidized region are formed in the intermediate semiconductor layer,
   the un-oxidized region is electrically connected to the first or second semiconductor multilayer reflector, and
   a beam generated in the active region is reflected at a boundary between the oxidized region and the un-oxidized region to a direction parallel to a principal surface of the substrate, and is emitted from a side surface of the intermediate semiconductor layer.

2. The semiconductor laser according to claim 1, wherein the intermediate semiconductor layer is comprised of a semiconductor layer with a constant film thickness including an Al composition, the Al composition increases gradually or linearly as a distance from the active region becomes small, and the oxidized region is formed by being oxidized from the side surface of the intermediate semiconductor layer.

3. The semiconductor laser according to claim 1, wherein the intermediate semiconductor layer is comprised of a semiconductor layer with a constant film thickness including an Al composition, the Al composition increases in a quadric manner as a distance from the active region becomes small, and the oxidized region is formed by being oxidized from the side surface of the intermediate semiconductor layer.

4. The semiconductor laser according to claim 1, wherein the intermediate semiconductor layer is comprised of a semiconductor layer with a constant film thickness including an Al composition, the Al composition decreases as a distance from the active region becomes small, and the oxidized region is formed by being oxidized from the side surface of the intermediate semiconductor layer.

5. The semiconductor laser according to claim 1, wherein the intermediate semiconductor layer is comprised of a semiconductor layer with a constant film thickness including an Al composition, the Al composition is uniform, and the oxidized region is formed by being oxidized from an exposed surface of the intermediate semiconductor layer.

6. The semiconductor laser according to claim 1, further comprising a current confining layer including a conductive region surrounded by an oxidized area, which is selectively oxidized, on the substrate, wherein the a boundary of the oxidized area of the intermediate semiconductor layer lies in an optical axis direction of the conductive region.

7. A fabrication method of making the semiconductor laser of claim 1, comprising:
   stacking at least the first semiconductor multilayer reflector, the active region, the second semiconductor multilayer reflector, and the intermediate semiconductor layer;
   forming a groove to expose a side surface of the intermediate semiconductor layer by etching the semiconductor layer; and
   forming a boundary between an oxidized region and an un-oxidized region in the intermediate semiconductor layer by selectively oxidizing a part of the intermediate semiconductor layer from a side surface exposed by the groove.

8. The fabrication method according to claim 7, wherein the intermediate semiconductor layer is comprised of a semiconductor layer of which an Al composition increases gradually or linearly as a distance from the active region becomes small.

9. The fabrication method according to claim 7, wherein the intermediate semiconductor layer is comprised of a semiconductor layer of which an Al composition increases in a quadric manner as a distance from the active region becomes small.

10. A fabrication method of making the semiconductor laser of claim 1, comprising:
   stacking at least the first semiconductor multilayer reflector, the active region, the second semiconductor multilayer reflector, and the intermediate semiconductor layer;
   forming a groove reaching to a surface of the intermediate semiconductor layer by etching the intermediate semiconductor layer;
   forming an oxidized region, which is selectively oxidized from a surface selected by the groove, in the intermediate semiconductor layer; and
   cutting the substrate through the groove.

11. The fabrication method according to claim 10 further comprising:
   forming columnar structures in regions sandwiching the groove respectively by etching the semiconductor layer,
   wherein the current confining layers in respective columnar structures are selectively oxidized simultaneously when oxidizing the oxidized region in the intermediate semiconductor layer.

12. The fabrication method according to claim 10 further comprising:
   forming a cavity in the intermediate semiconductor layer by etching the oxidized region of the intermediate semiconductor layer; and
   filling a light transmissive material in the cavity through the groove.

13. A semiconductor laser device comprising:
   a semiconductor laser;
   an optical transmission member; and
   a circuit substrate which packages the semiconductor laser and the optical transmission member;
   the semiconductor laser including:
     a substrate;
     a first semiconductor multilayer reflector of a first conductive type formed on the substrate;
     an active region formed on the first semiconductor multilayer reflector;
     a second semiconductor multilayer reflector of a second conductive type formed on the active region;
     a third semiconductor multilayer reflector of a first conductive type or a second conductive type on the substrate; and
     an intermediate semiconductor layer of a first conductive type or a second conductive type formed between the first semiconductor multilayer reflector and the third semiconductor multilayer reflector, or between the second semiconductor multilayer reflector and the third semiconductor multilayer reflector;
     wherein an oxidized region formed by oxidizing a part of the intermediate semiconductor layer and an un-oxidized region contacting with the oxidized region are formed in the intermediate semiconductor layer,
     the un-oxidized region is electrically connected to the first or second semiconductor multilayer reflector, and
     a beam generated in the active region is reflected at a boundary between the oxidized region and the un-oxidized region to a direction parallel to a principal surface of the substrate, and is emitted from a side surface of the intermediate semiconductor layer, and
   the optical transmission member being arranged to face the side surface of the intermediate semiconductor layer of the semiconductor laser, and transmitting a beam emitted from the intermediate semiconductor layer.

14. The semiconductor laser device according to claim 13, wherein a plurality of semiconductor lasers and a plurality of optical transmission members, which are connected to the plurality of semiconductor lasers respectively, are packaged on the circuit substrate.

* * * * *